(12) United States Patent
Grokop

(10) Patent No.: US 9,706,303 B2
(45) Date of Patent: *Jul. 11, 2017

(54) SPEAKER EQUALIZATION FOR MOBILE DEVICES

(71) Applicant: QUALCOMM Incorporated, San Diego, CA (US)

(72) Inventor: Leonard Henry Grokop, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/083,124

(22) Filed: Mar. 28, 2016

(65) Prior Publication Data

US 2016/0212532 A1 Jul. 21, 2016

Related U.S. Application Data

(63) Continuation of application No. 13/765,424, filed on Feb. 12, 2013, now Pat. No. 9,300,266.

(51) Int. Cl.
*H04R 3/04* (2006.01)
*H03G 5/16* (2006.01)
(Continued)

(52) U.S. Cl.
CPC ............... *H04R 3/04* (2013.01); *H03G 5/165* (2013.01); *H04M 1/6016* (2013.01); *H04R 29/001* (2013.01); *H04S 7/307* (2013.01); *H04M 2250/12* (2013.01); *H04R 2430/01* (2013.01); *H04R 2460/07* (2013.01); *H04R 2499/11* (2013.01)

(58) Field of Classification Search
CPC ........................................................ H04R 3/04
USPC .......... 379/388.03, 433.13, 406.03; 381/103, 381/107, 160, 56, 58, 74, 309; 455/418, 455/550.1, 557, 569.1; 181/156; 375/229

See application file for complete search history.

(56) References Cited

U.S. PATENT DOCUMENTS 5,881,103 A * 3/1999 Wong ................. H03H 17/0227
375/229
6,011,853 A * 1/2000 Koski ....................... H04L 1/20
381/103
(Continued)

FOREIGN PATENT DOCUMENTS

EP 2056622 A1 5/2009
WO 2008075082 A1 6/2008
(Continued)

OTHER PUBLICATIONS

Grokop, et al. "Activity Recognition for Content Aware Mobile Devices", QTech Forum 2011, pp. 1.1-1-11-9, Jun. 4-16, 2011.
(Continued)

*Primary Examiner* — Gerald Gauthier
(74) *Attorney, Agent, or Firm* — Muncy, Geissler, Olds & Lowe, P.C.

(57) ABSTRACT

Disclosed is an apparatus and method for speaker equalization in a mobile device. In one embodiment, placement of a mobile device including a speaker is determined and speaker equalization is performed in accordance with the determined placement.

30 Claims, 6 Drawing Sheets

(51) Int. Cl.
*H04M 1/60* (2006.01)
*H04R 29/00* (2006.01)
*H04S 7/00* (2006.01)

(56) References Cited

U.S. PATENT DOCUMENTS

| | | | |
|---|---|---|---|
| 6,233,462 B1 | 5/2001 | Kanai | |
| 6,252,968 B1 | 6/2001 | Narasimhan et al. | |
| 6,292,563 B1 * | 9/2001 | Clark | H04M 1/0216 379/433.13 |
| 6,639,987 B2 | 10/2003 | McIntosh | |
| 7,079,645 B1 * | 7/2006 | Short | H04M 1/6016 379/387.01 |
| 7,483,540 B2 | 1/2009 | Rabinowitz et al. | |
| 7,953,456 B2 | 5/2011 | Romesburg et al. | |
| 8,095,073 B2 | 1/2012 | Hayes et al. | |
| 8,144,897 B2 | 3/2012 | Ranta | |
| 8,238,567 B2 | 8/2012 | Burge et al. | |
| 8,238,570 B2 * | 8/2012 | Johnson, Jr. | H04R 1/1041 381/311 |
| 8,238,590 B2 * | 8/2012 | Burge | H04R 1/1041 381/309 |
| 8,243,946 B2 * | 8/2012 | Burge | H04R 1/1041 381/74 |
| 8,254,984 B2 | 8/2012 | Kerr | |
| 8,401,178 B2 * | 3/2013 | Chen | G10L 21/0208 379/406.02 |
| 8,699,719 B2 | 4/2014 | Johnson, Jr. et al. | |
| 8,848,932 B2 * | 9/2014 | Poulsen | H03G 3/301 381/104 |
| 8,918,146 B2 | 12/2014 | Khawand | |
| 9,042,815 B2 | 5/2015 | Rizkallah et al. | |
| 9,313,359 B1 * | 4/2016 | Stojancic | H04N 1/32 |
| 2005/0217926 A1 * | 10/2005 | Murata | H04R 5/02 181/156 |
| 2006/0245583 A1 | 11/2006 | Mizushima et al. | |
| 2007/0223736 A1 * | 9/2007 | Stenmark | H03G 5/005 381/103 |
| 2007/0223745 A1 * | 9/2007 | Feng | H04M 1/04 381/160 |
| 2008/0063219 A1 * | 3/2008 | Park | H03F 3/217 381/107 |
| 2008/0146289 A1 * | 6/2008 | Korneluk | H04M 1/6041 455/569.1 |
| 2008/0207264 A1 * | 8/2008 | Harmke | H04M 1/6008 455/557 |
| 2008/0219672 A1 | 9/2008 | Tam et al. | |
| 2009/0029745 A1 | 1/2009 | Eaton | |
| 2009/0099812 A1 | 4/2009 | Kahn et al. | |
| 2009/0167542 A1 | 7/2009 | Culbert et al. | |
| 2010/0082488 A1 | 4/2010 | Evans et al. | |
| 2010/0246855 A1 | 9/2010 | Chen | |
| 2010/0329473 A1 | 12/2010 | Rauhala | |
| 2011/0086626 A1 * | 4/2011 | Kerr | H04M 1/605 455/418 |
| 2012/0157114 A1 | 6/2012 | Alameh et al. | |
| 2012/0303360 A1 | 11/2012 | Grokop et al. | |
| 2013/0316686 A1 | 11/2013 | Subbaramoo et al. | |
| 2014/0003626 A1 | 1/2014 | Holman et al. | |
| 2014/0226837 A1 * | 8/2014 | Grokop | H04M 1/6016 381/103 |
| 2015/0233718 A1 | 8/2015 | Grokop | |

FOREIGN PATENT DOCUMENTS

| | | |
|---|---|---|
| WO | 2009014557 A1 | 1/2009 |
| WO | 2014063755 A1 | 5/2014 |

OTHER PUBLICATIONS

International Search Report and Written Opinion—PCT/US2014/015751—ISA/EPO—May 21, 2014.
Przywara L., et al., "Group Report: Using Sensor Data to Improve the User Experience of Audio Applications" Oct. 10, 2013 (Oct. 10, 2013). XP055116935. Retrieved from the Internet: URL:http://www.projectbarbq.comjreports/bbq13/Project Bar-B-Q 2013 report section 6. pdf—[retrieved on May 8, 2014], pp., 1-14, the whole document.

* cited by examiner

SPEAKER EQUALIZATION FOR MOBILE DEVICES

CROSS-REFERENCE TO RELATED APPLICATIONS

The present Application for Patent is a Continuation of U.S. Non-Provisional application Ser. No. 13/765,424, entitled "SPEAKER EQUALIZATION FOR MOBILE DEVICES", filed on Feb. 12, 2013, which is assigned to the assignee hereof and hereby expressly incorporated by reference herein in its entirety.

FIELD

The subject matter disclosed herein relates generally to mobile device speaker equalization.

BACKGROUND

Mobile devices may have multiple functions to enable phone calls, play music, and display video. A user's placement of mobile devices can vary depending on user preferences as well as the particular function of the mobile device. Mobile device speaker performance can vary drastically depending on the mobile device placement. For example, a mobile device placed speaker face down on a desk/table may produce a muffled sound where high frequencies are unnaturally attenuated. Alternatively, the same mobile device placed speaker face up may produce a sound with the opposite effect. When the mobile device is placed in a user's hand, the speaker may point away from the user or be partially occluded, producing yet a different frequency response.

Therefore, new and improved speaker equalization techniques are desirable.

SUMMARY

In one embodiment, placement of a mobile device including a speaker is determined and speaker equalization is performed in accordance with the placement of the mobile device. The placement of the mobile device may partially obstruct one or more speakers or remove an obstruction from one or more speakers. The placement may be determined based on data from a camera, ambient light sensor, accelerometer, magnetometer, gyroscope, barometric pressure sensor, global positioning sensor, or WiFi sensor.

In one embodiment, a predetermined speaker equalization configuration is identified. The predetermined speaker equalization configuration may be based at least in part on the placement of the mobile device and a frequency range output by a speaker may be adjusted in accordance with the predetermined speaker equalization configuration.

DETAILED DESCRIPTION

Mobile Device Overview

Figure 1:
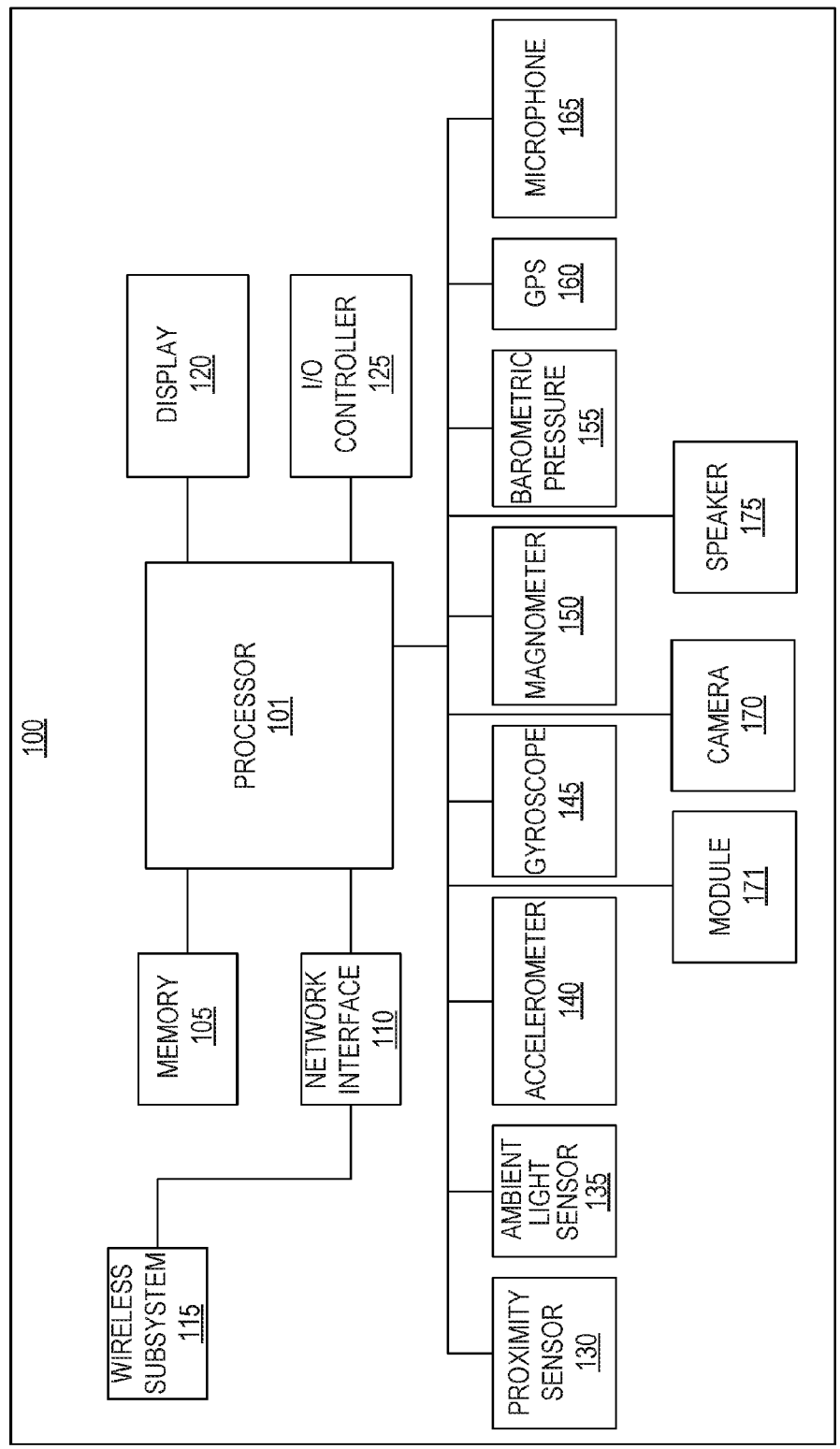
FIG. 1 is a block diagram of a system in which aspects of the invention may be practiced, in one embodiment.

FIG. 1 is block diagram illustrating an exemplary data processing system in which embodiments of the invention may be practiced. The system may be a mobile device 100, which may include one or more processors 101, a memory 105, I/O controller 125, and network interface 110. Mobile device 100 may also include a number of sensors coupled to one or more buses or signal lines further coupled to the processor 101. It should be appreciated that mobile device 100 may also include a display 120, a user interface (e.g., keyboard, touch-screen, or similar devices), a power device (e.g., a battery), as well as other components typically associated with electronic devices. Network interface 110 may also be coupled to a number of wireless subsystems 115 (e.g., Bluetooth, WiFi, Cellular, or other networks) to transmit and receive data streams through a wireless link to/from a wireless network, or may be a wired interface for direct connection to networks (e.g., the Internet, Ethernet, or other wireless systems). Thus, mobile device 100 may be a: gaming device, wireless device, cell phone, personal digital assistant, mobile computer, tablet, personal computer, laptop computer, or any type of device that has processing capabilities.

The mobile device 100 can include sensors such as a proximity sensor 130, ambient light sensor (ALS) 135, accelerometer 140, gyroscope 145, magnetometer 150, barometric pressure sensor 155, and/or Global Positioning Sensor (GPS) 160. In some embodiments, microphone 165, camera 170, and/or the wireless subsystem 115 are used as sensors to analyze the environment of the mobile device 100. For example, images from camera 170 can provide data for determining whether the camera 170 is being blocked by an external object which in turn can help determine the location of the mobile device 100 (e.g., within a user's hand or on a desk/surface).

The memory 105 may be coupled to processor 101 to store instructions for execution by processor 101. In some embodiments, the memory 105 is non-transitory. The memory 105 may also store one or more models or modules to implement embodiments described below. The memory 105 may also store data from integrated or external sensors. In addition, the memory 105 may store application program interfaces (APIs) for accessing one or more modules 171 (e.g., Content Aware Speaker Equalization or Classifier) described in greater detail below. The processor 101 can access the modules 171 via one or more buses or signal lines further coupled to the processor 101. The memory 105 may also store files relating to the equalization configurations and training data set described below.

It should be appreciated that embodiments of the invention as will be hereinafter described may be implemented through the execution of instructions, for example as stored in the memory 105 or other element, by processor 101 of mobile device 100 and/or other circuitry of mobile device 100 and/or other mobile devices. Particularly, circuitry of mobile device 100, including but not limited to processor 101, may operate under the control of a program, routine, or the execution of instructions to execute methods or processes in accordance with embodiments of the invention. For example, such a program may be implemented in firmware or software (e.g., stored in memory 105 and/or other locations) and may be implemented by processors, such as processor 101, and/or other circuitry of mobile device 100. Further, it should be appreciated that the terms processor, microprocessor, circuitry, controller, etc., may refer to any type of logic or circuitry capable of executing logic, commands, instructions, software, firmware, functionality and the like.

Further, it should be appreciated that some or all of the functions, engines or modules described herein may be performed by mobile device 100 itself and/or some or all of the functions, engines or modules described herein may be performed by another system connected through I/O controller 125 or network interface 110 (wirelessly or wired) to mobile device 100. Thus, some and/or all of the functions may be performed by another system and the results or intermediate calculations may be transferred back to mobile device 100. In some embodiments, such other devices may comprise a device configured to process information in real time or near real time. In some embodiments, the other device is configured to predetermine the results, for example based on a known configuration of the mobile device 100.

Context Aware Speaker Equalization Overview

Mobile device sensors can provide contextual data about a user's actions and mobile device environment. Context, as used herein may be any information that can be used to characterize the situation of a user or mobile device.

In one embodiment, Context Aware Speaker Equalization (CASE) can opportunistically adjust one or more speaker equalization configurations or settings to improve a user's listening experience. In some embodiments, the CASE can be implemented as a module or engine, such as module/engine 171.

Figure 2:
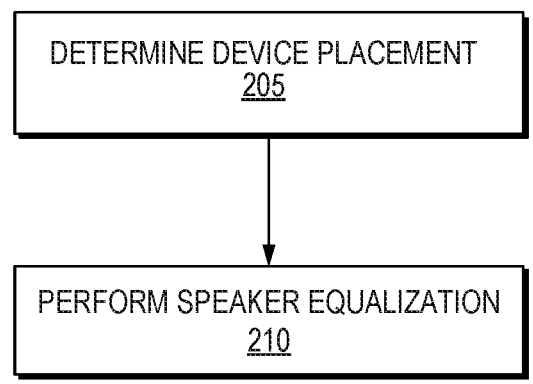
FIG. 2 illustrates a flow diagram of Context Aware Speaker Equalization, in one embodiment.

FIG. 2 illustrates a flow diagram of Context Aware Sensor Equalization, in one embodiment. At block 205, the CASE can determine the placement of a mobile device. Alternatively, the CASE may receive a placement determination from a Classifier or other separate module. In some embodiments, the Classifier can be implemented as a module or engine, such as module/engine 171.

Mobile device placement may be inferred from data received from one or more sensors as described in greater detail below.

At block 210, the CASE can perform speaker equalization. In one embodiment, the CASE selects and applies a speaker equalization configuration from one or more predetermined equalization configurations according to or based on the determined placement of the mobile device. The speaker equalization configuration may cause one or more speakers of the mobile device to change an output frequency. In some embodiments, although speaker output volume may change during some equalization adjustments, volume can be a separately controlled output setting/configuration independent from speaker equalization as used herein. Equalization configurations and the application of the configurations are described in greater detail below.

Mobile Device Placement Determination

The CASE can determine mobile device placement through the use of one or more of integrated or external sensors (e.g., one of the sensors described above). Placement as used herein relates to a position and orientation of the mobile device 100. The placement of the mobile device 100 may be relative to a user or physical object (e.g., desk, surface, stand, case, or other object). Example placements include, but are not limited to: device face down on a surface, device face up on a surface, device handheld, device on a stand, and device in an enclosure. As used herein, the face of the mobile device may be the front of the device, or the portion of the device where the user interacts with the device (e.g., views a display and enters input via a touchscreen, keyboard, or other main input hardware).

Placement may also describe mobile device speaker position and orientation. For example, a mobile device face down with a speaker at the front of the device may result in a speaker face down position. Alternatively, a mobile device face down with a speaker at the back of the device may result in a speaker face up position. Therefore, placement may be relative to the mobile device 100 as well as to one or more speakers. In some embodiments, upon determining a mobile device placement, the CASE can also determine a relative speaker placement based on a predetermined mobile device configuration. Persons of skill in the art will recognize that many other placements are possible and compatible with the embodiments described herein.

In some embodiments, the CASE requests a determination of mobile device placement from a separate module or program (e.g., a Classifier module). Persons of skill in the art will recognize that although the Classifier module is described below as a separate module, the features and functions of the Classifier module may also be integrated directly into the CASE (e.g., as a CASE module with placement determination capability).

Figure 3:
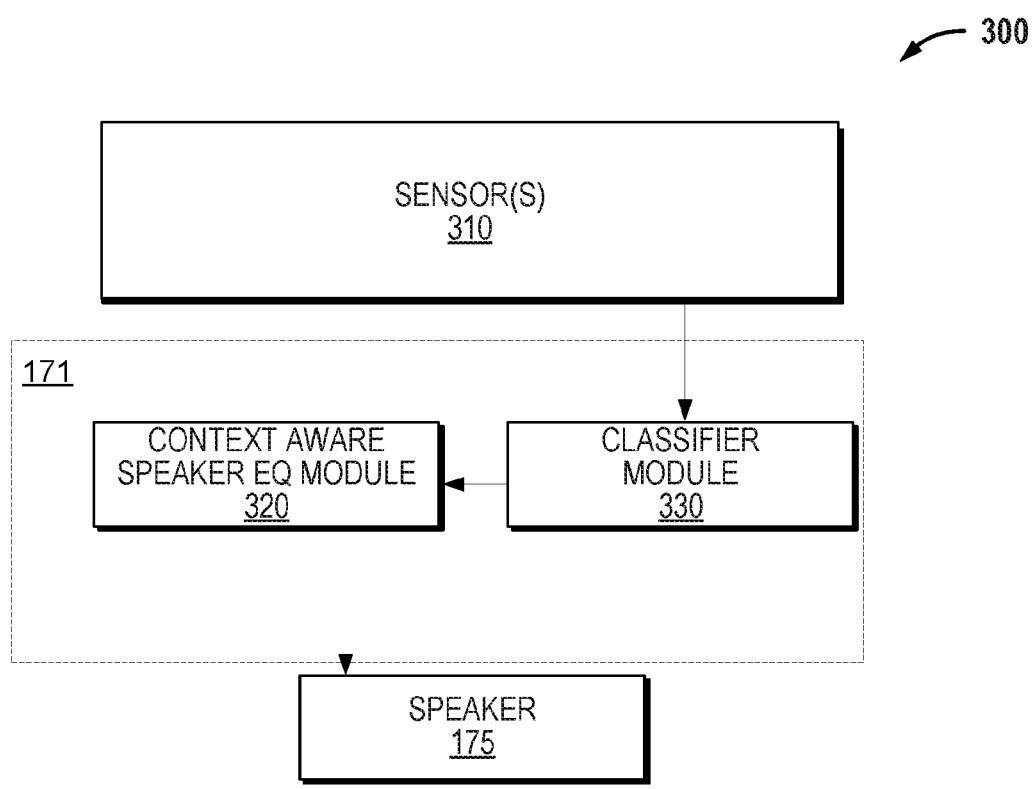
FIG. 3 is block diagram of a system including sensors and exemplary processing modules, in one embodiment.

FIG. 3 is block diagram of a mobile device system including sensors and exemplary processing modules, in one embodiment. The CASE module 320 (hereinafter referred to as CASE) may use an output classification from the Classifier module 330 (hereinafter referred to as the Classifier) to adjust the equalization configurations of one or more speaker(s) 175.

The Classifier can process or extract one or more features from one or more sensors 310 (e.g., a sensor data sample from the ALS 135, camera 170, microphone 165, proximity sensor 130, accelerometer 140, GPS 160, gyroscope 145, or other sensor) and report information related to a mobile device's environment. The Classifier may also receive external sensor data from communicatively connected external devices (e.g., via a USB connection or WiFi connection to an external camera) through the I/O controller 125.

Features described herein refer to the result or output of computations executed on sensor data. Features can be used to classify a data set and infer a mobile device placement. For example, data from an accelerometer may have attributes of time, acceleration along an x-axis, acceleration along a y-axis, and acceleration along a z-axis. The Classifier can receive as input, raw sensor data (e.g., a sensor data sample) from accelerometer, and calculate mean and/or standard deviation. The Classifier can use the mean and/or standard deviation to classify or provide context to the accelerometer sensor data. The Classifier may determine mobile device orientation by measuring the direction of a force equal to gravity. For example, when the device is face down on a surface, the only force recorded by the accelerometer may be gravity in the direction of the mobile device (face down).

A sensor data sample can include a portion of data received or output from a sensor sampled at a particular frequency (e.g., 50 Hz, 60 Hz or other rate depending on the sampling device and the data requirements). Feature computation may be performed on a moment, slice, or window of time selected from a stream or set of sensor data. For example, mobile device 100 may compute features over one second time period selected from a longer stream (e.g., a ten second time period, constantly on sensor, or some other time period). For example, raw accelerometer data may be sampled at 60 Hz such that one second of data provides 60 3-dimensional accelerometer vector samples in the x-axis, y-axis, and z-axis for a net input size of 180 samples.

In one embodiment, the CASE may determine placement of the mobile device upon determining activation of the mobile device speaker(s). For example, the user may place a phone onto speakerphone mode, which may trigger the CASE or Classifier to determine the placement and subsequently adjust the equalization of the speaker. In another example, a user may start a video file or audio file on the mobile device to trigger the CASE and a determination of placement.

In other embodiments, the mobile device may have an always on low power sensor and associated dedicated Classifier (e.g., the proximity sensor 130).

Certain sensors may be used by the Classifier to establish or eliminate the possibility of specific mobile device placements. The Classifier may initially determine which placements are feasible given proximity sensor 130, ALS 135, camera 170, or other sensor data. For example, if the proximity sensor 130 on the front face of a mobile device registers, (i.e., an object is close to the sensor) or if the ALS or camera output is below a threshold value, the respective sensor may be obstructed or occluded. Sensor obstructions may be likely for a device face down on a surface, device handheld or a device in an enclosure. Detection of an obstruction or occlusion in combination with knowledge about a mobile device's sensor layout (e.g., ALS on the front, camera on the back) may eliminate a subset of placements from consideration by the Classifier. For example, a mobile device with an ALS on the front face and a camera on the rear face of the device may be determined to be device face down on a surface if the ALS is occluded while the camera is not.

The above description of example sensors and techniques are but a few of the possible ways to determine device placement. Persons of skill in the art will recognize that a multitude of sensors (e.g., camera, ambient light sensor, accelerometer, magnetometer, gyroscope, barometric pressure sensor, global positioning sensor, and WiFi sensor, or a combination of these sensors, just to name a few) can be used for determining mobile device placement and speaker equalization as described herein.

Mobile Device Profiles

In one embodiment, the CASE may use the placement determination as a basis for adjusting one or more speaker equalization configurations. Depending on the placement of the particular mobile device, one or more speakers may benefit from an updated equalization configuration. For example, upon determining the mobile device is face down on a surface, the CASE can refer to a Mobile Device Profile (MDP) to automatically determine an equalization configuration associated with equalizing the speaker performance of the device face down on a surface. In another example, MDP for mobile device "A" may have one equalization configuration for one or more speakers when in a handheld placement, and a different equalization configuration for a face down placement on a surface. If a placement cannot be determined with enough accuracy (e.g., a classification does not meet or exceed a confidence threshold), no equalization may be applied (e.g., flat equalization or no attenuation/amplification to any frequency).

In one embodiment, mobile devices can be identified and associated with a specific MDP. The CASE may determine one of a plurality of MDPs to apply to a device by referencing one or more of a: serial number, model number, device ID, or a range of IDs associated with the MDP. Alternatively, rather than searching for a matching MDP, a single assigned MDP may be preinstalled or setup for access by the CASE. Each model or line of mobile devices may use the same MDP when an audio configuration is the same across the model or line.

Different types and models of mobile device may have different MDPs because of differences in speaker placement, speaker specification, the number of speakers, and other unique characteristics. For example, the MDP for mobile device "A" may have an integrated speaker of type "X" at the front face of the mobile device. MDP for mobile device "B" may have two integrated stereo speakers: one left speaker of type "Y" at the bottom left front face of the mobile device, and one speaker of type "Z" at the bottom right front face of the mobile device. Persons of skill in the art will recognize that an infinite number of speaker combinations, placements, types and configurations are possible and each speaker in the device may have an independent and unique equalization configuration.

Each speaker may have different frequency response characteristics and respond differently to equalization adjustments. For example, one speaker type may be able to reproduce minute sound detail while a different speaker type may take heavy equalization adjustments to output a minimal change in frequency. In one embodiment, the CASE can adjust the equalization of each individual speaker independently from each of the speakers in the mobile device. For example, the CASE may determine that the mobile device placement is in a user's hand with one of two speakers obstructed. The CASE can adjust the equalization configurations of the obstructed speaker separately from the unobstructed speaker.

Equalization Configurations and Calibration

Calibration or matching of the equalization configurations to a specific mobile device may be predetermined within a test environment (e.g., a controlled sound proof chamber). Within the test environment all possible device placements and speaker combinations can be measured. For example, one or more pilot signals or tones can be generated from the specific mobile device for a variety of placements as described above. When the mobile device is placed in each position, the pilot signals or tones will undergo a frequency transformation, and the response can be measured from a relative point representing a listening user. A variety of different equalization configurations may be implemented during the testing process before settling on a final equalization configuration yielding the ideal speaker performance level or target output range.

Calibration for mobile devices with multiple speakers can be performed independently for each speaker. Therefore, when a mobile device determines a particular placement, each speaker equalization configuration can be applied individually. Alternatively, multiple speakers may be calibrated together as one speaker system, and the equalization configuration can be applied to both speakers to adjust the overall sound output from the mobile device.

When the ideal speaker performance level is achieved in the test environment, the associated equalization configurations, or the relative change in equalization configurations from a baseline can be saved to memory and/or associated with the device specific MDP. The CASE can call or reference the equalization configuration when detecting a real world placement similar to the prior test environment placement.

Applying Equalization Configurations

In one embodiment, the CASE can determine a placement, match a mobile device to an MDP, and apply mobile device specific equalization configurations based on the particular placement (e.g., device face down on a surface, device face up on a surface, device handheld, device on a stand, and device in an enclosure).

Figure 4A:
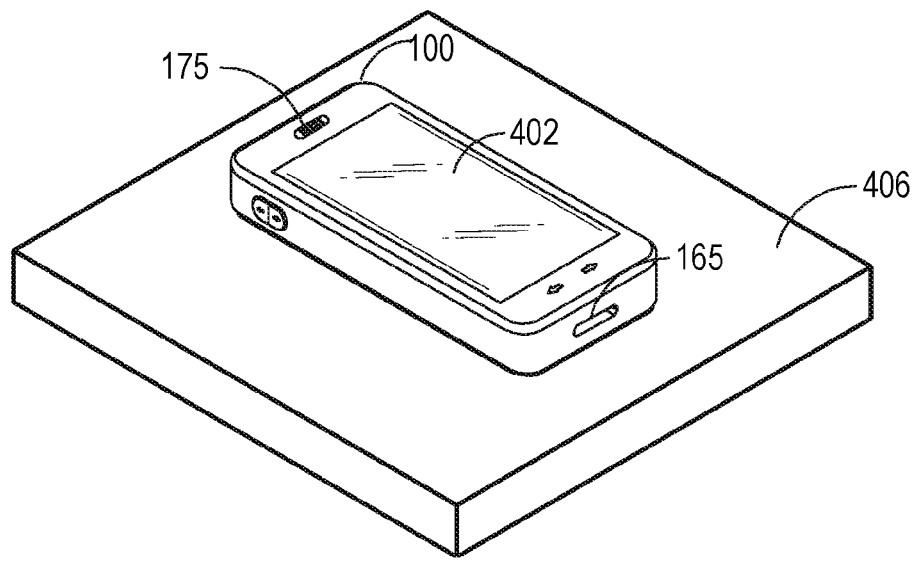
FIG. 4A and FIG. 4B illustrate a device face up on a surface according to one embodiment.
Figure 4B:
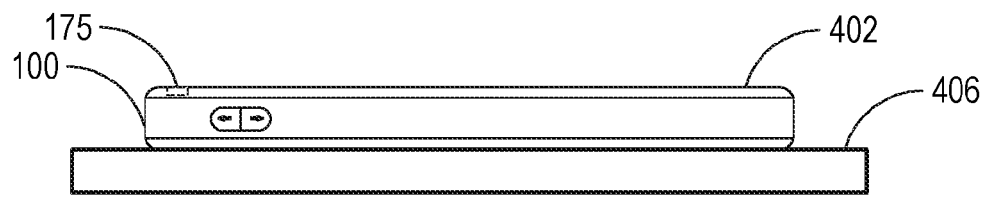

FIG. 4A and FIG. 4B illustrate a device face up on a surface according to one embodiment. The speaker 175 is unobstructed, as is the entire front face 402 of the mobile device 100. The audio response from the speaker may be different than an obstructed or occluded speaker because the speaker 175 is unobstructed. The CASE can determine a face up on a surface placement of the mobile device, and refer to the MDP to find the matching equalization configurations. The matching equalization configurations can be applied to adjust the output from the speaker 175.

Figure 5A:
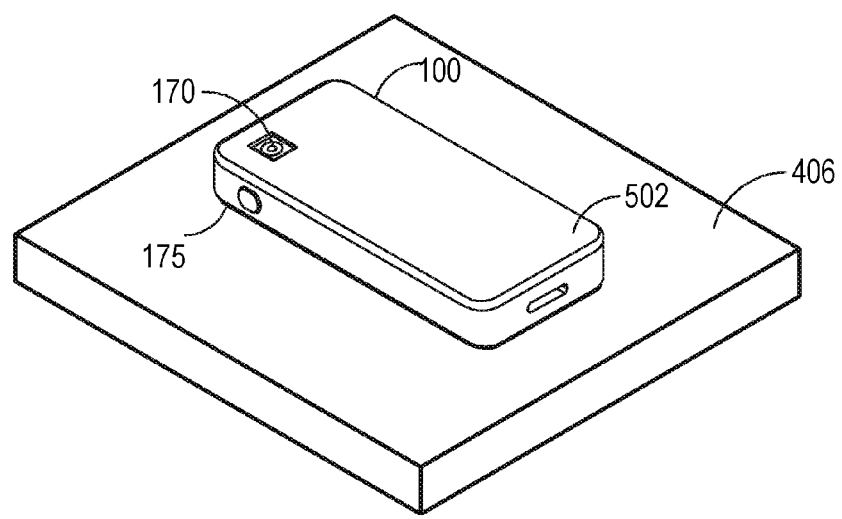
FIG. 5A and FIG. 5B illustrate a device face down on a surface according to one embodiment.
Figure 5B:
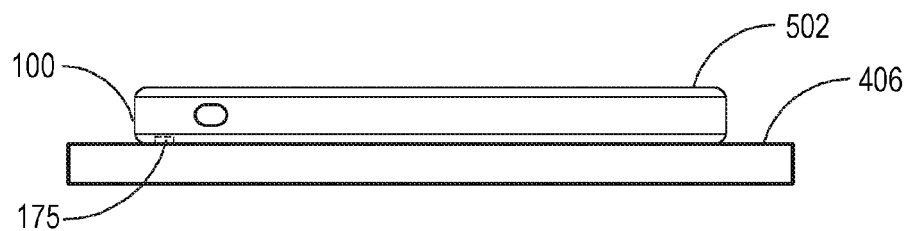

FIG. 5A and FIG. 5B illustrate a device face down on a surface according to one embodiment. Speaker 175 is now obstructed by the adjacent surface 406, as is the entire front face 402 of the mobile device 100. The rear face 502 of the mobile device 100 is unobstructed. Because speaker 175 is obstructed or occluded, the audio response from the speaker will be different than an unobstructed speaker, and the CASE will adjust the speaker equalization configurations accordingly. The CASE can determine a face down on a surface placement of the mobile device, and refer to the MDP to find the matching equalization configurations. Persons of skill in the art will appreciate that the speaker may be obstructed or unobstructed in either face down or face up positioning depending on the particular device configuration. The CASE as described herein can adjust the speaker equalization for a variety of different mobile device configurations with a variety of speaker configurations (e.g., speaker in the front, back, side, bottom or other positioning).

As discussed above, the particular equalization configuration associated with a placement may be determined based on prior calibration in a controlled test environment. For example, while the speaker is face down on a surface such as a desk, the surface may increase bass response over the baseline level while also muffling a range of frequencies. Therefore, to return to the baseline equalization performance, the associated MDP may enable equalization configurations to weaken the output bass and adjust other frequencies to compensate for the particular mobile device placement.

Figure 6:
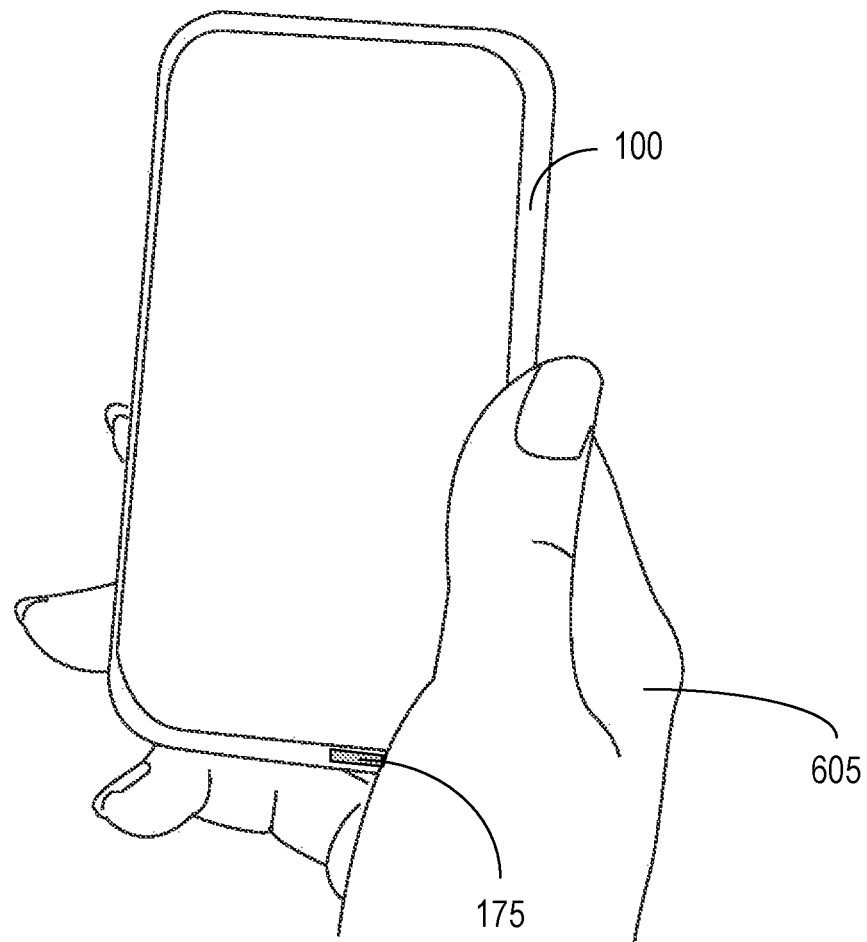
FIG. 6 illustrates a device held in a hand according to another embodiment.

FIG. 6 illustrates a mobile device held in a hand according to another embodiment. Because the mobile device speaker 175 is projecting from a user's hand, the audio response from the speaker may be different than when a mobile device is not in a user's hand, and the CASE can automatically adjust the speaker equalization configurations accordingly. The mobile device speaker 175 may be fully or partially obstructed by the user's hand 605 causing a muffled sound projection. The mobile device speaker 175 may be unobstructed but aimed away from a user, causing the user to receive sub-optimal sound.

As discussed above, the device handheld equalization configuration may be determined based on prior tests in a controlled environment. A device handheld may have multiple sub-placements such as handheld aimed at various positions (e.g., held a distance away from the user, or at an angle from the user), handheld one speaker obstructed, or handheld multiple speakers obstructed. In one embodiment, a device handheld is calibrated to the various sub-placements and an average equalization configuration most applicable to all device handheld placements is generated and associated with the MDP. In other embodiments, each sub-placement may be a separate placement detectable by the Classifier and each sub-placement can have a unique equalization configuration.

In one embodiment, a mobile device may be placed on a stand at one of a number of angles or orientations. Each variation on the device on stand may have sub-placements with their own equalization configuration. For example, a tablet may be placed on a stand in landscape mode for optimum movie viewing, or may be angled in portrait mode to accommodate a keyboard attachment. During the calibration phase, the mobile device in various placements on a stand can be tested to determine if a change in baseline equalization can be detected. For example, depending on the angle, and the placement of the speaker(s), the mobile device may reflect sound off a surface or the stand in different ways that can be compensated for in a customized equalization configuration. For each detectable different stand placement the MDP may have an associated equalization profile. Alternatively, the stand placement may consist of an average equalization configuration that represents a best performance setting applicable to most stand sub-placements.

In another embodiment, the CASE can determine whether the device is in an enclosure, such as a bag, pocket, mobile device case, or other similar surroundings. The enclosure placement may be an average of all possible equalization configurations used in the various sub-placements, or each sub-placement may be determined separately and have an associated equalization configuration.

Persons of skill in the art will recognize that the above placement examples are a few exemplary placements and are not meant to limit the disclosure. The word "exemplary" or "example" is used herein to mean "serving as an example, instance, or illustration." Any aspect or embodiment described herein as "exemplary" or as an "example" is not necessarily to be construed as preferred or advantageous over other aspects or embodiments.

It should be appreciated that when the mobile device 100 is a wireless device, it may communicate via one or more wireless communication links through a wireless network that are based on or otherwise supported by any suitable wireless communication technology. For example, in some aspects a computing device or server may associate with a network including a wireless network. In some aspects the network may comprise a body area network or a personal area network (e.g., an ultra-wideband network). In some aspects the network may comprise a local area network or a wide area network. A wireless device may support or otherwise use one or more of a variety of wireless communication technologies, protocols, or standards such as, for example, CDMA, TDMA, OFDM, OFDMA, WiMAX, and Wi-Fi. Similarly, a wireless device may support or otherwise use one or more of a variety of corresponding modulation or multiplexing schemes. A mobile wireless device may wirelessly communicate with other mobile devices, cell phones, other wired and wireless computers, Internet web-sites, etc.

The teachings herein may be incorporated into (e.g., implemented within or performed by) a variety of apparatuses (e.g., devices). For example, one or more aspects taught herein may be incorporated into a phone (e.g., a cellular phone), a personal data assistant (PDA), a tablet, a mobile computer, a laptop computer, an entertainment device (e.g., a music or video device), a headset (e.g., headphones, an earpiece, etc.), a medical device (e.g., a biometric sensor, a heart rate monitor, a pedometer, an Electrocardiography (EKG) device, etc.), a user I/O device, a computer, a server, a point-of-sale device, a set-top box, or any other suitable device. These devices may have different power and data requirements and may result in different power profiles generated for each feature or set of features.

In some aspects a wireless device may comprise an access device (e.g., a Wi-Fi access point) for a communication system. Such an access device may provide, for example, connectivity to another network (e.g., a wide area network such as the Internet or a cellular network) via a wired or wireless communication link. Accordingly, the access device may enable another device (e.g., a Wi-Fi station) to access the other network or some other functionality. In addition, it should be appreciated that one or both of the devices may be portable or, in some implementations, relatively non-portable.

Those of skill in the art understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software as a computer program product, the functions may be stored on or transmitted over as one or more instructions or code on a non-transitory computer-readable medium. Computer-readable media can include both computer storage media and communication media including any medium that facilitates transfer of a computer program from one place to another. A storage media may be any available media that can be accessed by a computer. By way of example, and not limitation, such non-transitory computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a web site, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of non-transitory computer-readable media.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A method of performing speaker equalization for a mobile device, comprising:
    determining a placement of the mobile device, wherein the mobile device includes a set of speakers and wherein the placement of the mobile device is indicative of whether at least one speaker of the set of speakers is at least partially obstructed by one or more external objects; and
    performing a speaker equalization adjustment by transitioning a first speaker equalization configuration of the mobile device to a second speaker equalization configuration in accordance with the placement of the mobile device.

2. The method of claim 1,
wherein the placement of the mobile device is indicative of being face down on a surface, causing one or more front-facing speakers to be at least partially obstructed by the surface,
wherein the mobile device being at least partially obstructed by the surface is indicative of increased base response over a baseline level and/or a muffling of a range of frequencies, and
wherein the performing the speaker equalization adjustment comprises weakening an output base level to account for the increased base response and/or adjusting one or more other frequencies associated with the set of speakers to account for the muffling of the range of frequencies.

3. The method of claim 1,
wherein the placement of the mobile device is indicative of being held by a user, causing the at least one speaker to be at least partially obstructed by a hand of the user,
wherein the mobile device being at least partially obstructed by the hand of the user causes a muffled sound projection from the at least one speaker, and
wherein the performing performs the speaker equalization adjustment to account for the muffled sound projection.

4. The method of claim 1, further comprising
determining whether a direction at which at least one speaker is outputting sound is towards or away from a user of the mobile device,
wherein the performing performs the speaker equalization adjustment in accordance with the direction at which at least one speaker is outputting sound.

5. The method of claim 1, wherein the speaker equalization adjustment is configured for the mobile device while being held by a user in any of a plurality of handheld placements.

6. The method of claim 1, wherein the determining the placement of the mobile device is based, at least in part, on accelerometer sensor data that indicates force in a direction of the mobile device, wherein the placement of the mobile device is indicative of being face down on a surface.

7. The method of claim 1, wherein the determining the placement of the mobile device is based, at least in part, on a first optical sensor on a front of the mobile device being at least partially obstructed while a second optical sensor on a back of the mobile device is unobstructed, wherein the placement of the mobile device is indicative of being face down on a surface.

8. The method of claim 1, wherein the determining is triggered based on playback initiation of a video file or an audio file on the mobile device.

9. The method of claim 1,
wherein the set of speakers includes a first speaker with a first set of frequency response characteristics and a second speaker with a second set of frequency response characteristics, and
wherein the performing the speaker equalization adjustment comprises allocating different frequency modifications to the first and second speakers based on the first and second sets of frequency response characteristics, respectively.

10. A mobile device, comprising:
a set of speakers; and
at least one processor coupled to memory and configured to:
determine a placement of the mobile device, wherein the placement of the mobile device is indicative of whether at least one speaker of the set of speakers is at least partially obstructed by one or more external objects; and
perform a speaker equalization adjustment by transitioning a first speaker equalization configuration of the mobile device to a second speaker equalization configuration in accordance with the placement of the mobile device.

11. The mobile device of claim 10,
wherein the placement of the mobile device is indicative of being face down on a surface, causing one or more front-facing speakers to be at least partially obstructed by the surface,
wherein the mobile device being at least partially obstructed by the surface is indicative of increased base response over a baseline level and/or a muffling of a range of frequencies, and
wherein the at least one processor performs the speaker equalization adjustment by weakening an output base level to account for the increased base response and/or adjusting one or more other frequencies associated with the set of speakers to account for the muffling of the range of frequencies.

12. The mobile device of claim 10,
wherein the placement of the mobile device is indicative of being held by a user, causing the at least one speaker to be at least partially obstructed by a hand of the user,
wherein the mobile device being at least partially obstructed by the hand of the user causes a muffled sound projection from the at least one speaker, and
wherein the at least one processor performs the speaker equalization adjustment to account for the muffled sound projection.

13. The mobile device of claim 10,
wherein the at least one processor determines whether a direction at which at least one speaker is outputting sound is towards or away from a user of the mobile device, and
wherein the at least one processor performs the speaker equalization adjustment in accordance with the direction at which at least one speaker is outputting sound.

14. The mobile device of claim 10, wherein the speaker equalization adjustment is configured for the mobile device while being held by a user in any of a plurality of handheld placements.

15. The mobile device of claim 10,
wherein the at least one processor determines the placement of the mobile device based, at least in part, on accelerometer sensor data that indicates force in a direction of the mobile device, wherein the placement of the mobile device is indicative of being face down on a surface, or
wherein the at least one processor determines the placement of the mobile device based, at least in part, on a first optical sensor on a front of the mobile device being at least partially obstructed while a second optical sensor on a back of the mobile device is unobstructed, wherein the placement of the mobile device is indicative of being face down on the surface.

16. The mobile device of claim 10, wherein the at least one processor triggers the placement determination based on playback initiation of a video file or an audio file on the mobile device.

17. The mobile device of claim 10,
wherein the set of speakers includes a first speaker with a first set of frequency response characteristics and a second speaker with a second set of frequency response characteristics, and
wherein the at least one processor performs the speaker equalization adjustment by allocating different frequency modifications to the first and second speakers based on the first and second sets of frequency response characteristics, respectively, to perform the speaker equalization.

18. A mobile device, comprising:
means for determining a placement of the mobile device, wherein the placement of the mobile device is indicative of whether at least one speaker of a set of speakers is at least partially obstructed by one or more external objects; and
means for performing a speaker equalization adjustment by transitioning a first speaker equalization configuration of the mobile device to a second speaker equalization configuration in accordance with the placement of the mobile device.

19. The mobile device of claim 18,
wherein the placement of the mobile device is indicative of being face down on a surface, causing one or more front-facing speakers to be at least partially obstructed by the surface,
wherein the mobile device being at least partially obstructed by the surface is indicative of increased base response over a baseline level and/or a muffling of a range of frequencies, and
wherein the means for performing comprises means for weakening an output base level to account for the increased base response and/or adjusting one or more other frequencies associated with the set of speakers to account for the muffling of the range of frequencies.

20. The mobile device of claim 18,
wherein the placement of the mobile device is indicative of being held by a user, causing the at least one speaker to be at least partially obstructed by a hand of the user,
wherein the mobile device being at least partially obstructed by the hand of the user causes a muffled sound projection from the at least one speaker, and
wherein the means for performing performs the speaker equalization adjustment to account for the muffled sound projection.

21. The mobile device of claim 18,
wherein the means for determining determines whether a direction at which at least one speaker is outputting sound is towards or away from a user of the mobile device, and
wherein the means for performing performs the speaker equalization adjustment in accordance with the direction at which at least one speaker is outputting sound.

22. The mobile device of claim 18, wherein the speaker equalization adjustment is configured for the mobile device while being held by a user in any of a plurality of handheld placements.

23. The mobile device of claim 18,
wherein the means for determining determines the placement of the mobile device based, at least in part, on accelerometer sensor data that indicates force in a direction of the mobile device, wherein the placement of the mobile device is indicative of being face down on a surface, or
wherein the means for determining determines the placement of the mobile device based, at least in part, on a first optical sensor on a front of the mobile device being at least partially obstructed while a second optical sensor on a back of the mobile device is unobstructed, wherein the placement of the mobile device is indicative of being face down on the surface.

24. The mobile device of claim 18, wherein the means for determining triggers the placement determination based on playback initiation of a video file or an audio file on the mobile device.

25. The mobile device of claim 18,
wherein the set of speakers includes a first speaker with a first set of frequency response characteristics and a second speaker with a second set of frequency response characteristics, and
wherein the means for performing the speaker equalization adjustment comprises allocating different frequency modifications to the first and second speakers based on the first and second sets of frequency response characteristics, respectively, to perform the speaker equalization.

26. A non-transitory computer-readable medium containing instructions stored thereon, which, when executed by a mobile device, cause the mobile device to perform operations, the instructions comprising:
at least one instruction to cause the mobile device to determine a placement of the mobile device, wherein the placement of the mobile device is indicative of whether at least one speaker of a set of speakers is at least partially obstructed by one or more external objects; and
at least one instruction to cause the mobile device to perform a speaker equalization adjustment by transitioning a first speaker equalization configuration of the mobile device to a second speaker equalization configuration in accordance with the placement of the mobile device.

27. The non-transitory computer-readable medium of claim 26,
wherein the placement of the mobile device is indicative of being face down on a surface, causing one or more front-facing speakers to be at least partially obstructed by the surface,
wherein the mobile device being at least partially obstructed by the surface is indicative of increased base response over a baseline level and/or a muffling of a range of frequencies, and
wherein the at least one instruction to cause the mobile device to perform comprises at least one instruction to cause the mobile device to weaken an output base level to account for the increased base response and/or adjusting one or more other frequencies associated with the set of speakers to account for the muffling of the range of frequencies.

28. The non-transitory computer-readable medium of claim 26, further comprising:
at least one instruction to cause the mobile device to determine whether a direction at which at least one speaker is outputting sound is towards or away from a user of the mobile device,
wherein the at least one instruction to cause the mobile device to perform the speaker equalization adjustment causes the mobile device to perform the speaker equalization adjustment in accordance with the direction at which at least one speaker is outputting sound.

29. The non-transitory computer-readable medium of claim 26, wherein the at least one instruction to cause the mobile device to determine the placement of the mobile device is based, at least in part, on accelerometer sensor data that indicates force in a direction of the mobile device, wherein the placement of the mobile device is indicative of being face down on a surface, or wherein the at least one instruction to cause the mobile device to determine the placement of the mobile device is based, at least in part, on a first optical sensor on a front of the mobile device being at least partially obstructed while a second optical sensor on a back of the mobile device is unobstructed, wherein the placement of the mobile device is indicative of being face down on the surface.

30. The non-transitory computer-readable medium of claim 26, wherein the set of speakers includes a first speaker with a first set of frequency response characteristics and a second speaker with a second set of frequency response characteristics, and wherein the at least one instruction to cause the mobile device to perform the speaker equalization adjustment comprises at least one instruction to cause the mobile device to allocate different frequency modifications to the first and second speakers based on the first and second sets of frequency response characteristics, respectively.

* * * * *